(12) United States Patent
Hibino et al.

(10) Patent No.: US 8,871,111 B2
(45) Date of Patent: Oct. 28, 2014

(54) PIEZOELECTRIC/ELECTROSTRICTIVE CERAMIC COMPOSITION

(75) Inventors: Tomohiko Hibino, Nagoya (JP); Takaaki Koizumi, Tajimi (JP)

(73) Assignee: NGK Insulators, Ltd., Nagoya (JP)

( * ) Notice: Subject to any disclaimer, the term of this patent is extended or adjusted under 35 U.S.C. 154(b) by 480 days.

(21) Appl. No.: 12/404,598

(22) Filed: Mar. 16, 2009

(65) Prior Publication Data

US 2009/0236557 A1 Sep. 24, 2009

Related U.S. Application Data

(60) Provisional application No. 61/037,372, filed on Mar. 18, 2008.

(30) Foreign Application Priority Data

Feb. 5, 2009 (JP) ................... 2009-024825

(51) Int. Cl.
*C04B 35/00* (2006.01)
*H01L 41/187* (2006.01)
*C04B 35/499* (2006.01)
*C04B 35/491* (2006.01)

(52) U.S. Cl.
CPC ....... *C04B 35/491* (2013.01); *C04B 2235/3244* (2013.01); *C04B 2235/768* (2013.01); *C04B 2235/77* (2013.01); *H01L 41/1876* (2013.01); *H01L 41/1878* (2013.01); *C04B 2235/3298* (2013.01); *C04B 2235/786* (2013.01); *C04B 2235/3296* (2013.01); *C04B 35/499* (2013.01); *C04B 2235/3232* (2013.01); *C04B 2235/81* (2013.01); *C04B 2235/3279* (2013.01); *C04B 2235/3251* (2013.01)
USPC .................................................. 252/62.9 PZ

(58) Field of Classification Search
USPC ......................... 252/62.9 PZ, 62.9 R
See application file for complete search history.

(56) References Cited

U.S. PATENT DOCUMENTS 6,118,209 A * 9/2000 Okuyama et al. ............. 310/358
6,140,746 A   10/2000 Miyashita et al.
(Continued)

FOREIGN PATENT DOCUMENTS

CN   1742121 A   3/2006
CN   1956234 A   5/2007
(Continued)

OTHER PUBLICATIONS

Kholkin. Fatigue of piezoelectric properties in Pb(Zr,Ti)O3 films. Appl. Phys. Lett. 68, 2577 (1996); doi: 10.1063/1.116189.*

(Continued)

*Primary Examiner* — Matthew E Hoban
(74) *Attorney, Agent, or Firm* — Burr & Brown, PLLC

(57) ABSTRACT

A piezoelectric/electrostrictive ceramic composition is provided which exhibits high density and excellent crystallinity even in the case of firing under lower temperature conditions than in conventional cases, and which also exhibits excellent piezoelectric/electrostrictive properties. An $ABO_3$ compound (first main component) with Bi at the A site and with B1 and B2 elements at the B site (B1 consists of at least one kind of element having an ionic valence of two or less and selected from the group consisting of Mg, Cr, Mn, Fe, Co, Ni, Cu, Zn, and rare-earth elements; and B2 consists of at least one kind of element having an ionic valence of four or more and selected from the group consisting of V, Nb, Ta, Sb, Mo, and W) is dissolved in the form of a solid solution into another $ABO_3$ compound (second main component) with at least Pb at the A site.

1 Claim, 1 Drawing Sheet

(56) References Cited

U.S. PATENT DOCUMENTS

| | | | |
|---|---|---|---|
| 7,965,020 B2 * | 6/2011 | Sakaki et al. | 310/358 |
| 2006/0043863 A1 | 3/2006 | Yamaguchi et al. | |
| 2006/0044730 A1 | 3/2006 | Yamaguchi et al. | |
| 2006/0279901 A1 | 12/2006 | Miyamoto et al. | |
| 2007/0060467 A1 | 3/2007 | Matsuda et al. | |
| 2008/0074004 A1 | 3/2008 | Yamamoto et al. | |
| 2008/0074471 A1 | 3/2008 | Sakashita et al. | |
| 2009/0069294 A1 | 3/2009 | Chen et al. | |

FOREIGN PATENT DOCUMENTS

| | | |
|---|---|---|
| EP | 1637508 | 3/2006 |
| JP | S45-030151 | 9/1970 |
| JP | S47-021696 | 10/1972 |
| JP | S48-012717 | 4/1973 |
| JP | 48-014839 | 5/1973 |
| JP | 49-085598 | 8/1974 |
| JP | 49-085598 | 9/1974 |
| JP | S60-215568 | 10/1985 |
| JP | 62-089372 | 4/1987 |
| JP | H09-223831 | 8/1997 |
| JP | 2000-178068 | 6/2000 |
| JP | 2001-328864 | 11/2001 |
| JP | 2006-089366 | 4/2006 |
| JP | 2006-188414 A1 | 7/2006 |
| JP | 2008-094707 A1 | 4/2008 |
| WO | 2006-129434 | 12/2006 |
| WO | 2008-096761 | 8/2008 |
| WO | WO2008/096761 * | 8/2008 |

OTHER PUBLICATIONS

Zhang. Investigation of bismuth-based perovskite system: $(1-x)Bi(Ni_{2/3}Nb_{1/3})O_3-xPbTiO_3$. Journal of Applied Physics vol. 98, Issue 3. Aug. 2005.*

Remiens. Piezoelectric properties of sputtered PZT films: influence of structure, micro structure, film thickness (Zr,Ti) ratio and Nb substitution. Materials Science in Semiconductor Processing 5 (2003) 123-127.*

Japanese Office Action (and translation provided by foreign counsel) from a corresponding Japanese patent application bearing a mailing date of Feb. 5, 2013, 7 pages.

* cited by examiner

PIEZOELECTRIC/ELECTROSTRICTIVE CERAMIC COMPOSITION

BACKGROUND OF THE INVENTION

1. Field of the Invention

The present invention relates to a piezoelectric/electrostrictive ceramic composition.

2. Description of the Background Art

Piezoelectric/electrostrictive devices used in diesel engine injectors and the like employ an Ag/Pd-based electrode as their inner electrode in view of costs. Since the Ag/Pd-based electrode has a low melting point, it is required to reduce the firing temperature of such piezoelectric/electrostrictive ceramics. To be more specific, piezoelectric/electrostrictive ceramic compositions that are densified at a firing temperature of less than 1000° C. are desired. To this end, using a sintering agent to reduce the firing temperature has been considered. The use of a sintering agent, however, has a drawback in that the original piezoelectric/electrostrictive properties may be reduced.

Japanese Patent Application Laid-open No. 2006-188414 discloses a substance represented by the general formula: $xBiMeO_3$-$yPbZrO_3$-$(1-x-y)PbTiO_3$ (where Me is Sc and/or In.) In Japanese Patent Application Laid-open No. 2008-94707, an element is selected based on the ionic radius in a perovskite structure, $Bi(Al, Fe, M)O_3$, with Bi at the A site (M is at least any one of Cr, Mn, Co, Ni, Ga, and Sc). These composition design may promote deformation due to the tolerance factor calculated from the ionic radius, but in practical cases, satisfactory piezoelectric characteristics can not be obtained because the perovskite structure is hard to be synthesized, or availability in practical application can not be realized because of low density or because of low insulating performance due to the volatilization of the element Bi at high temperatures.

The present invention has been made in view of these conventional problems and has an object to provide a piezoelectric/electrostrictive ceramic composition with high density and excellent crystallinity, even in the case of firing under lower temperature conditions than in conventional cases; and with excellent piezoelectric/electrostrictive properties.

SUMMARY OF THE INVENTION

According to an aspect of the present invention, a piezoelectric/electrostrictive ceramic composition contains: a first main component composed of an $ABO_3$ compound with Bi at the A site that has a valence of three and with B1 and B2 elements at the B site that has a valence of three; and a second main component composed of an $ABO_3$ compound with at least Pb at the A site. The B1 element consists of at least one kind of element having an ionic valence of two or less and selected from the group consisting of Mg, Cr, Mn, Fe, Co, Ni, Cu, Zn, and rare-earth elements. The B2 element consists of at least one kind of element having an ionic valence of four or more and selected from the group consisting of V, Nb, Ta, Sb, Mo, and W.

According to another aspect of the present invention, the piezoelectric/electrostrictive ceramic composition contains: a first main component composed of an $ABO_3$ compound with Bi at the A site that has a valence of three and with B1 and B2 elements at the B site that has a valence of three; and a second main component composed of an $ABO_3$ compound with at least Pb at the A site and with at least two kinds of elements selected from the group consisting of Mg, Al, Sc, Ga, Cr, Mn, Fe, Co, Ni, Cu, Zn, V, Nb, Ta, Sb, Mo, W, In, Ti, Zr, Hf, and rare-earth elements at the B site that has a valence of four. The B1 element consists of at least one kind of element having an ionic valence of two or less and selected from the group consisting of Mg, Cr, Mn, Fe, Co, Ni, Cu, Zn, and rare-earth elements. The B2 element consists of at least one kind of element having an ionic valence of four or more and selected from the group consisting of V, Nb, Ta, Sb, Mo, and W.

According to still another aspect of the present invention, the piezoelectric/electrostrictive ceramic composition contains: a first main component composed of an $ABO_3$ compound with Bi at the A site that has a valence of three and with an element selected from the group consisting of Mg, Ni, Zn, and Mn and an element selected from the group consisting of Nb and Ta at the B site that has a valence of three; and a second main component composed of an $ABO_3$ compound with at least Pb at the A site and with Ti and Zr at the B site that has a valence of four.

Even in firing under low-temperature conditions, the piezoelectric/electrostrictive ceramic composition provided exhibits high density and excellent crystallinity as well as excellent piezoelectric/electrostrictive properties.

It is, therefore, an object of the present invention to provide a piezoelectric/electrostrictive ceramic composition with high density and excellent crystallinity, even in the case of firing under lower-temperature conditions than in conventional cases; and with excellent piezoelectric/electrostrictive properties.

These and other objects, features, aspects and advantages of the present invention will become more apparent from the following detailed description of the present invention when taken in conjunction with the accompanying drawings.

DETAILED DESCRIPTION OF THE INVENTION

Figure 1:
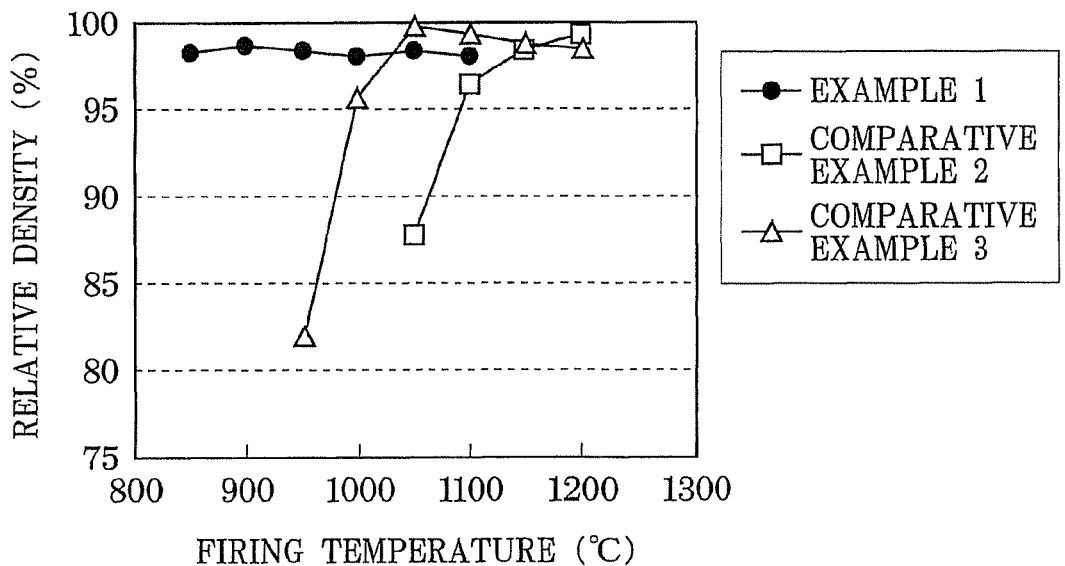
FIG. 1 shows changes in relative density at different firing temperatures.

As a result of diligent study to solve the above problems, the inventors have accomplished the present invention, concluding that the above problems can be solved by the use of a Bi compound, the melting point of which can be low for low-temperature firing, and then by the dissolution of an $ABO_3$ compound (first main component) with Bi at the A site and B1 and B2 elements at the B site in the form of a solid solution into another $ABO_3$ compound (second main component) with at least Pb at the A site, in order to develop piezoelectric/electrostrictive properties such as excellent electric-field-induced strain properties (B1 consists of at least one kind of element having an ionic valence of two or less and selected from the group consisting of Mg, Cr, Mn, Fe, Co, Ni, Cu, Zn, and rare-earth elements; and B2 consists of at least one kind of element having an ionic valence of four or more and selected from the group consisting of V, Nb, Ta, Sb, Mo, and W.)

Bi compounds, typified by $Bi_2O_3$, are known as low-melting materials and used as raw materials for sintering agents, low-melting glass, and the like. Typical examples of Bi-based $ABO_3$ structural materials that include Bi as a main constituent element include $Bi_{1/2}Na_{1/2}TiO_3$, $Bi_{1/2}K_{1/2}TiO_3$, and $BiFeO_3$ and are capable of being synthesized by atmospheric firing, but they are inferior in piezoelectric/electrostrictive properties because of their stable $ABO_3$ structure.

On the other hand, composite $ABO_3$ compounds except $BiFeO_3$ with Bi at the A site and with the B site having a valence of three cannot maintain their $ABO_3$ structure because they are unstable and thus difficult to be synthesized in a single phase by atmospheric firing. However, if they maintain their $ABO_3$ structure, they may be able to attain excellent piezoelectric/electrostrictive properties derived from their instability.

It is thus considered that dissolving a Pb-based $ABO_3$ compound as a skeleton into a solid solution may allow the $ABO_3$ structure to be maintained.

More specifically, this is based on the idea that the combination of two different kinds of $ABO_3$ compounds that are different in tolerance factor (cf. Equation 1) defined by the ionic radius of each $ABO_3$ compound will easily cause the deformation of a perovskite structure.

$$t = \frac{(r_A + r_O)}{\sqrt{2}\,(r_B + r_O)} \qquad (1)$$

where $r_A$ is the A-site ionic radius, $r_B$ is the B-site ionic radius, and $r_O$ is the oxide-ion radius.

Various compositions based on the above design have been examined, and it has been found that incorporating highly-valent ionic species, such as quadrivalent or higher-valent ions, on the B site is also effective in providing high insulating performance. As a result, the present invention has shown that, into the second main component that is a Pb-based piezoelectric/electrostrictive ceramic composition, the first main component composed of an $ABO_3$ compound with Bi having a different tolerance factor from the second main component and at the A site and with B1 and B2 elements at the B site is dissolved, which brings about the effect of improving the electric-field-induced strain properties in addition to achieving low-temperature firing with the Bi compound (the B1 element consists of at least one kind of element having an ionic valence of two or less and selected from the group consisting of Mg, Cr, Mn, Fe, Co, Ni, Cu, Zn, and rare earth elements; and the B2 element consists of at least one kind of element having an ionic valence of four or more and selected from the group consisting of V, Nb, Ta, Sb, Mo, and W.).

Examples of the first main component according to the present invention include $ABO_3$ compounds with Bi at the A site that has a valence of three and with the B site having a valence of three, and more specifically, $Bi(Ni_{2/3}Nb_{1/3})O_3$, $Bi(Mg_{2/3}Nb_{1/3})O_3$, $Bi(Zn_{2/3}Nb_{1/3})O_3$, $Bi(Cu_{2/3}Nb_{1/3})O_3$, $Bi(Fe_{2/3}Nb_{1/3})O_3$, $Bi(Mn_{2/3}Nb_{1/3})O_3$, $Bi(Co_{2/3}Nb_{1/3})O_3$, $Bi(Cr_{2/3}Nb_{1/3})O_3$, $Bi(Ni_{2/3}V_{1/3})O_3$, $Bi(Mg_{2/3}V_{1/3})O_3$, $Bi(Zn_{2/3}V_{1/3})O_3$, $Bi(Cu_{2/3}V_{1/3})O_3$, $Bi(Fe_{2/3}V_{1/3})O_3$, $Bi(Mn_{2/3}V_{1/3})O_3$, $Bi(Co_{2/3}V_{1/3})O_3$, $Bi(Cr_{2/3}V_{1/3})O_3$, $Bi(Ni_{2/3}Ta_{1/3})O_3$, $Bi(Mg_{2/3}Ta_{1/3})O_3$, $Bi(Zn_{2/3}Ta_{1/3})O_3$, $Bi(Cu_{2/3}Ta_{1/3})O_3$, $Bi(Fe_{2/3}Ta_{1/3})O_3$, $Bi(Mn_{2/3}Ta_{1/3})O_3$, $Bi(Co_{2/3}Ta_{1/3})O_3$, $Bi(Cr_{2/3}Ta_{1/3})O_3$, $Bi(Mg_{3/4}Mo_{1/4})O_3$, $Bi(Ni_{3/4}Mo_{1/4})O_3$, $Bi(Zn_{3/4}W_{1/4})O_3$, $Bi(Cu_{3/4}W_{1/4})O_3$, $Bi(Fe_{3/4}W_{1/4})O_3$, $Bi(Mn_{3/4}W_{1/4})O_3$, $Bi(Mg_{3/4}W_{1/4})O_3$, $Bi(Ni_{3/4}W_{1/4})O_3$, $Bi(Zn_{3/4}W_{1/4})O_3$, $Bi(Cu_{3/4}W_{1/4})O_3$, $Bi(Fe_{3/4}W_{1/4})O_3$, $Bi(Mn_{3/4}W_{1/4})O_3$, and $Bi(Cu_{1/2}Nb_{1/2})O_3$. While the first main component has A- and B-site valences of three in terms of stoichiometry, it may have a non-stoichiometric composition for fine property control.

Examples of the second main component include $ABO_3$ compounds with at least Pb at the A site, and more specifically, PZT, $Pb(Mg, Nb)O_3$-PT, $Pb(Ni, Nb)O_3$-PT, $Pb(Zn, Nb)O_3$-PT, $Pb(Mg, Nb)O_3$-PZT, $Pb(Ni, Nb)O_3$-PZT, $Pb(Zn, Nb)O_3$-PT, $Pb(Yb, Nb)O_3$-PZT, $Pb(Co, Nb)O_3$-PZT, (Pb, Sr)ZT, and PLZT.

Alternatively, various secondary components may be used for substitution or addition in order to allow fine property control to such an extent as not to impair its basic properties.

EXAMPLES

Next, the present invention is described in more detail, referring to examples. The present invention is, however, not limited only thereto. The following describes how to measure various kinds of physical properties.

[Bulk Density Determination]

A sintered body (piezoelectric/electrostrictive body) is measured using Archimedes' law to calculate the relative density from the theoretical density measured by XRD (X-ray diffraction).

[Crystal Structure Analysis]

The crystal structure of the sintered body is analyzed by the $2\theta/\theta$ scan technique using an X-ray diffractometer. Also, the theoretical density is calculated from the crystal-structure information obtained.

[Microstructure Observation]

The surface microstructure of the sintered body and the internal microstructure thereof after polishing are observed under a scanning electron microscope to measure the grain size by the intercept method.

[Piezoelectric Constant Measurement]

The piezoelectric constant, $d_{31}$, is measured with reference to JEITA EM-4501.

[Curie Point Determination]

The relative-permittivity temperature characteristics are measured by connecting an electric furnace to an LCR meter, and the temperature at which the relative permittivity peaks is defined as the Curie point.

[Electric-Field-Induced Strain]

A strain gauge is attached to the electrode to measure, as the electric-field-induced strain (ppm), the amount of strain in the direction perpendicular to the electric field under the application of a 4 kV/mm voltage.

Example 1

Raw materials including PbO powder, $Bi_2O_3$ powder, NiO powder, $Nb_2O_5$ powder, $TiO_2$ powder, and $ZrO_2$ powder were weighed to attain the following composition (Equation 2) and were wet-mixed in a ball mill for 40 hours.

$$xBi(Ni_{2/3}Nb_{1/3})O_3\text{-}(1\text{-}x)Pb(Zr_{1\text{-}y}Ti_y)O_3 \qquad (2)$$

where $x=0.20$ and $y=0.625$

The mixed powder was dried and calcined in air at 800° C. for two hours. The powder was then ground and dried in the wet ball mill until a given specific surface area was attained, and it was sifted through a sieve for granulation, formed into a disc shape with a uniaxial pressurizer and a hydrostatic pressurizer, and enclosed in a ceramic sheath to be fired at 950° C.

The density of the sintered body was measured and the microstructure and the crystal structure were evaluated. To evaluate the electrical characteristics, after the sintered body was cut into 1-mm thick strip slices, it was coated on both sides with an Ag paste and fired at 600° C. to form electrodes. After these electrodes were polarized at 75° C. for 15 minutes at 2 kV/mm, the piezoelectric constant was measured. The electric-field-induced strain properties were also measured as well.

The results were as follows. The sintered body had a relative density of 98% and its crystal structure was a single-phase tetragonal perovskite structure. The microstructure observation showed that the average grain size was 4.7 μm. The piezoelectric constant $d_{31}$ was 195 pm/V, and the Curie temperature was 225° C. During the application of a 4 kV/mm electric field, the electric-field-induced strain was 1250 ppm.

Examples 2 to 12

The compositions given in Table 1 were prepared by a manufacturing method similar to the method in Example 1 and evaluated in the same manner as in Example 1. The result in each case was that densification was possible at 1000° C. or below and good piezoelectric characteristics were obtained.

TABLE 1

| | COMPOSITION | | | | THEORETICAL DENSITY |
|---|---|---|---|---|---|
| | COMPOSITION FORMULA | x | y | z | (g/cm³) |
| EXAMPLE 1 | $xBi(Ni_{2/3}Nb_{1/3})O_3-(1-x)Pb(Zr_{1-y}Ti_y)O_3$ | 0.20 | 0.625 | — | 8.07 |
| EXAMPLE 2 | $xBi(Ni_{2/3}Nb_{1/3})O_3-(1-x)Pb(Zr_{1-y}Ti_y)O_3$ | 0.20 | 0.610 | — | 8.10 |
| EXAMPLE 3 | $xBi(Ni_{2/3}Nb_{1/3})O_3-(1-x)Pb(Zr_{1-y}Ti_y)O_3$ | 0.20 | 0.620 | — | 8.10 |
| EXAMPLE 4 | $xBi(Ni_{2/3}Nb_{1/3})O_3-(1-x)Pb(Zr_{1-y}Ti_y)O_3$ | 0.20 | 0.630 | — | 8.08 |
| EXAMPLE 5 | $xBi(Ni_{2/3}Nb_{1/3})O_3-(1-x)Pb(Zr_{1-y}Ti_y)O_3$ | 0.20 | 0.640 | — | 8.11 |
| EXAMPLE 6 | $xBi(Ni_{2/3}Nb_{1/3})O_3-(1-x)Pb(Zr_{1-y}Ti_y)O_3$ | 0.10 | 0.545 | — | 8.05 |
| EXAMPLE 7 | $xBi(Ni_{2/3}Nb_{1/3})O_3-(1-x)Pb(Zr_{1-y}Ti_y)O_3$ | 0.15 | 0.590 | — | 8.07 |
| EXAMPLE 8 | $xBi(Ni_{2/3}Nb_{1/3})O_3-(1-x)Pb(Zr_{1-y}Ti_y)O_3$ | 0.25 | 0.705 | — | 8.13 |
| EXAMPLE 9 | $xBi(Ni_{2/3}Nb_{1/3})O_3-(1-x)Pb\{Zr_{1-y-z}Ti_y(Ni_{1/3}Nb_{2/3})_z\}O_3$ | 0.05 | 0.565 | 0.19 | 8.11 |
| EXAMPLE 10 | $xBi(Ni_{2/3}Nb_{1/3})O_3-(1-x)Pb\{Zr_{1-y-z}Ti_y(Ni_{1/3}Nb_{2/3})_z\}O_3$ | 0.10 | 0.590 | 0.13 | 8.10 |
| EXAMPLE 11 | $xBi(Ni_{2/3}Nb_{1/3})O_3-(1-x)Pb\{Zr_{1-y-z}Ti(Ni_{1/3}Nb_{2/3})_z\}O_3$ | 0.15 | 0.600 | 0.06 | 8.11 |
| EXAMPLE 12 | $xBi\{(Ni_{0.75}Zn_{0.25})_{2/3}Nb_{1/3}\}O_3-(1-x)Pb(Zr_{1-y}Ti_y)O_3$ | 0.20 | 0.615 | — | 8.05 |
| COMPARATIVE EXAMPLE 1 | $PbZr_{0.52}Ti_{0.48}O_3$ | | | | 8.00 |
| COMPARATIVE EXAMPLE 2 | $PbZr_{0.52}Ti_{0.48}O_3$ + 1 wt % PbO | | | | 8.00 |
| COMPARATIVE EXAMPLE 3 | $Pb(Ni_{1/3}Nb_{2/3})_{0.20}Zr_{0.37}Ti_{0.43}O_3$ | | | | 8.08 |
| COMPARATIVE EXAMPLE 4 | $0.20Bi(Al_{0.5}Fe_{0.5})O_3-0.80Pb(Zr_{0.35}Ti_{0.65})O_3$ | | | | — |

| | BULK DENSITY (g/cm³) | RELATIVE DENSITY (%) | CRYSTAL STRUCTURE | GRAIN SIZE (μm) | $d_{31}$ (pC/N) | 4 KV/MM ELECTRIC-FIELD-INDUCED STRAIN (ppm) | CURIE POINT (° C.) |
|---|---|---|---|---|---|---|---|
| EXAMPLE 1 | 7.94 | 98.4 | SINGLE-PHASE PEROVSKITE | 4.7 | 195 | 1250 | 225 |
| EXAMPLE 2 | 7.95 | 98.2 | SINGLE-PHASE PEROVSKITE | 3.7 | 230 | 1063 | 219 |
| EXAMPLE 3 | 7.97 | 98.5 | SINGLE-PHASE PEROVSKITE | 4.3 | 225 | 1131 | 223 |
| EXAMPLE 4 | 7.99 | 98.8 | SINGLE-PHASE PEROVSKITE | 5.3 | 177 | 1261 | 227 |
| EXAMPLE 5 | 7.95 | 98.1 | SINGLE-PHASE PEROVSKITE | 5.3 | 169 | 1250 | 231 |
| EXAMPLE 6 | 7.93 | 98.6 | SINGLE-PHASE PEROVSKITE | 5.8 | 80 | 906 | 277 |
| EXAMPLE 7 | 7.94 | 98.4 | SINGLE-PHASE PEROVSKITE | 3.5 | 137 | 1099 | 254 |
| EXAMPLE 8 | 7.94 | 97.6 | SINGLE-PHASE PEROVSKITE | 3.3 | 155 | 1061 | 206 |
| EXAMPLE 9 | 8.03 | 99.0 | SINGLE-PHASE PEROVSKITE | 3.7 | 171 | 1282 | 263 |
| EXAMPLE 10 | 7.98 | 98.5 | SINGLE-PHASE PEROVSKITE | 3.8 | 151 | 1135 | 246 |
| EXAMPLE 11 | 7.98 | 98.5 | SINGLE-PHASE PEROVSKITE | 4.7 | 193 | 1237 | 280 |
| EXAMPLE 12 | 7.95 | 98.8 | SINGLE-PHASE PEROVSKITE | 5.0 | 170 | 1251 | 233 |
| COMPARATIVE EXAMPLE 1 | NOT DENSIFIED | — | SINGLE-PHASE PEROVSKITE | 0.2 | — | — | — |
| COMPARATIVE EXAMPLE 2 | NOT DENSIFIED | — | SINGLE-PHASE PEROVSKITE | 0.2 | — | — | — |
| COMPARATIVE EXAMPLE 3 | 6.62 | 82.0 | SINGLE-PHASE PEROVSKITE | 1.9 | 91 | 485 | 240 |
| COMPARATIVE EXAMPLE 4 | NOT DENSIFIED | — | MESOPHASE | 0.2 | — | — | — |

Comparative Examples 1 to 4

The compositions given in Table 1 were prepared by a manufacturing method similar to the method in Example 1 and evaluated in the same manner as in Example 1. The results were either that a single-phase perovskite structure was not obtained because of unstable synthesis or that, even if the composition exhibited a perovskite structure, it was low in density and could not obtain good piezoelectric characteristics.

Figure 2:
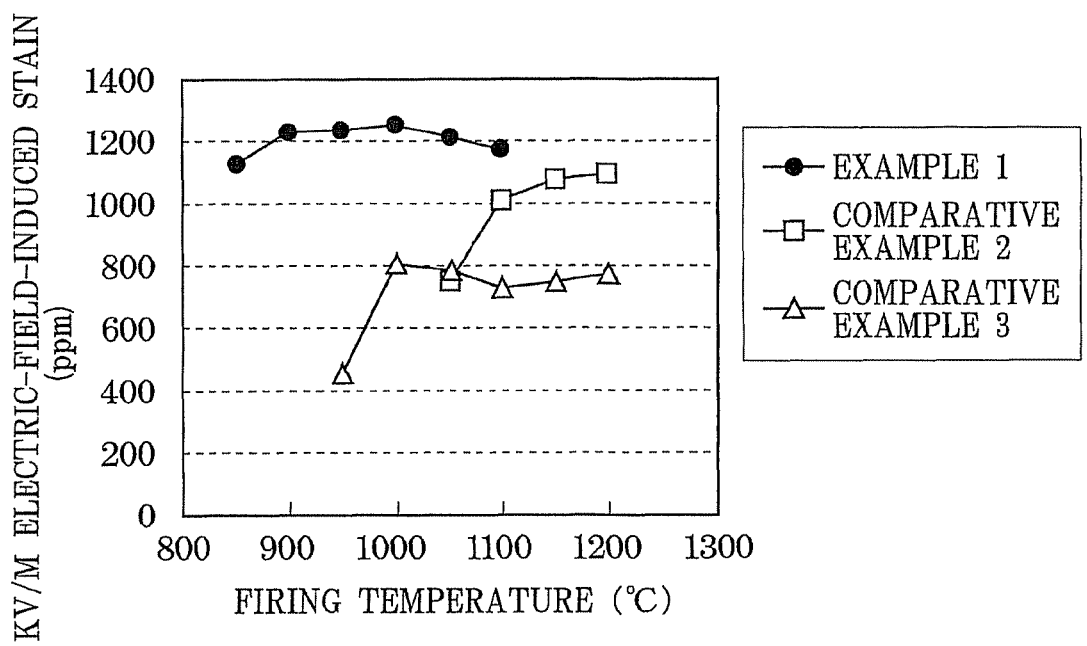
FIG. 2 shows changes in a 4 kV/mm electric-field-induced strain at different firing temperatures.

Changes in Relative Density and in 4 kV/mm Electric-Field-Induced Strain at Different Firing Temperatures FIGS. 1 and 2 showed the changes in the relative density and 4 kV/mm electric-field-induced strain of the sintered body, respectively, at different firing temperatures; sintered bodies have the same compositions as those in Example 1 and Comparative Examples 2 and 3 and were manufactured and evaluated by a manufacturing method similar to the method in Example 1, except that the firing temperature was varied.

As shown in FIGS. 1 and 2, although the sintered body having the same composition as that in Example 1 exhibited a good relative density and a high 4 kV/mm electric-field-induced strain even at firing temperatures below 1000° C., the sintered bodies having the same compositions as those in Comparative Examples 2 and 3 could only exhibit good relative densities and high 4 kV/mm electric-field-induced strains at firing temperatures of 1000° C. or higher.

While the invention has been shown and described in detail, the foregoing description is in all aspects illustrative and not restrictive. It is therefore understood that numerous modifications and variations can be devised without departing from the scope of the invention.

What is claimed is:

1. A piezoelectric/electrostrictive ceramic composition represented by the general formula: $x\text{Bi}(\text{Ni}_{2/3}\text{Nb}_{1/3})\text{O}_3(1-x)\text{Pb}(\text{Zr}_{1-y}\text{Ti}_y)\text{O}_3$, wherein x and y satisfy the following relationships: $0.20 \leq x \leq 0.25$ and $0.610 \leq y \leq 0.705$.

* * * * *

UNITED STATES PATENT AND TRADEMARK OFFICE
CERTIFICATE OF CORRECTION

PATENT NO. : 8,871,111 B2
APPLICATION NO. : 12/404598
DATED : October 28, 2014
INVENTOR(S) : Tomohiko Hibino and Takaaki Koizumi It is certified that error appears in the above-identified patent and that said Letters Patent is hereby corrected as shown below:

Title Page, Page 2, Column 1, line 7, Item (56), Foreign Patent Documents:

Please delete "JP  49-085598  9/1974"

Title Page, Page 2, Column 2, line 11, Item (56), Other Publications:

Please add "Extended European Search Report, EP Application No. 09250744.1, dated February 14, 2012 (8 pages)."

Signed and Sealed this
Thirty-first Day of March, 2015

Michelle K. Lee
*Director of the United States Patent and Trademark Office*